United States Patent
Park et al.

(10) Patent No.: US 10,510,532 B1
(45) Date of Patent: Dec. 17, 2019

(54) METHOD FOR MANUFACTURING GALLIUM NITRIDE SUBSTRATE USING THE MULTI ION IMPLANTATION

(71) Applicant: Industry-University Cooperation Foundation Hanyang University, Seoul (KR)

(72) Inventors: Jea Gun Park, Seongnam-si (KR); Jae Hyoung Shim, Seoul (KR); Tae Hun Shim, Suwon-si (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 15/991,505

(22) Filed: May 29, 2018

(51) Int. Cl.
| | |
|---|---|
| *H01L 21/762* | (2006.01) |
| *H01L 21/26* | (2006.01) |
| *H01L 21/02* | (2006.01) |
| *H01L 21/768* | (2006.01) |
| *H01L 21/265* | (2006.01) |

(52) U.S. Cl.
CPC ...... *H01L 21/02389* (2013.01); *H01L 21/265* (2013.01); *H01L 21/76871* (2013.01)

(58) Field of Classification Search
None
See application file for complete search history.

(56) References Cited

U.S. PATENT DOCUMENTS

2006/0264004 A1* 11/2006 Tong ................. H01L 21/76254
438/455

2007/0175384 A1  8/2007  Bruderl et al.
(Continued)

FOREIGN PATENT DOCUMENTS

| EP | 2 157 602 A1 | 2/2010 |
|---|---|---|
| JP | 2007273814 A | 10/2007 |

(Continued)

OTHER PUBLICATIONS

O. Moutanabbir et al., "Stress Adjustment and Bonding of H-Implanted 2 in. Freestanding GaN Wafer: The Concept of Double-Sided Splitting", Electronical and Solid-State Letters, 2009, pp. H105-H108, 12, 4.

*Primary Examiner* — Khaja Ahmad
(74) *Attorney, Agent, or Firm* — Sughrue Mion, PLLC

(57) ABSTRACT

Disclosed is a method of fabricating a gallium nitride substrate using a plurality of ion implantation processes. A method of fabricating a gallium nitride substrate using a plurality of ion implantation processes according to an embodiment of the present disclosure includes a step of forming a bonding oxide film on the first gallium nitride; a step of performing first ion implantation for a surface of the first gallium nitride, on which the bonding oxide film is formed, at least once to form a damaged layer, thereby releasing bowing of the first gallium nitride; a step of performing second ion implantation for the surface of the first gallium nitride, on which the bonding oxide film is formed, to form a blister layer; a step of bonding the bonding oxide film of the first gallium nitride to a temporary substrate; a step of separating the first gallium nitride using the blister layer to form a seed layer; and a step of allowing growth of the second gallium nitride using the seed layer to form bulk gallium nitride.

12 Claims, 7 Drawing Sheets

(56) References Cited

U.S. PATENT DOCUMENTS

| | | | | |
|---|---|---|---|---|
| 2011/0129988 A1* | 6/2011 | Signamarcheix | ............................ | H01L 21/76254 |
| | | | | 438/458 |
| 2012/0187412 A1* | 7/2012 | D'Evelyn | ............... | H01L 29/02 |
| | | | | 257/76 |
| 2013/0029473 A1* | 1/2013 | Kim | .................... | H01L 21/2654 |
| | | | | 438/458 |
| 2013/0089968 A1* | 4/2013 | Usenko | ............. | H01L 21/02238 |
| | | | | 438/458 |
| 2018/0040764 A1* | 2/2018 | Henley | ............. | H01L 21/76254 |

FOREIGN PATENT DOCUMENTS

| | | | |
|---|---|---|---|
| JP | 2009506969 | A | 2/2009 |
| JP | 2009120455 | A | 6/2009 |
| JP | 2011100860 | A | 5/2011 |
| JP | 2011-243968 | A | 12/2011 |
| JP | 2012-243792 | A | 12/2012 |
| JP | 20175180 | A | 1/2017 |
| KR | 10-1581044 | B1 | 12/2015 |
| WO | 2007025497 | A1 | 3/2007 |

* cited by examiner

[FIG. 1A]
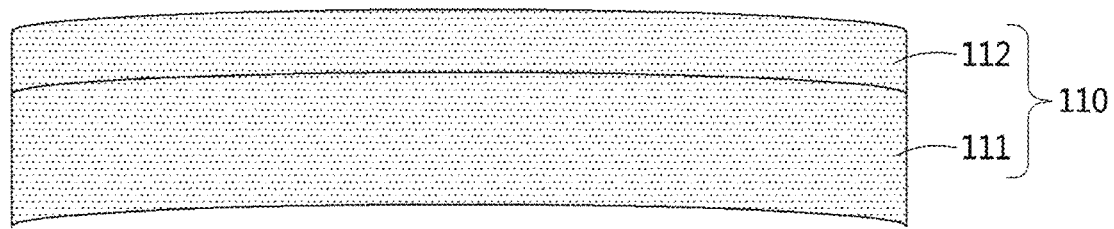
[FIG. 1B]
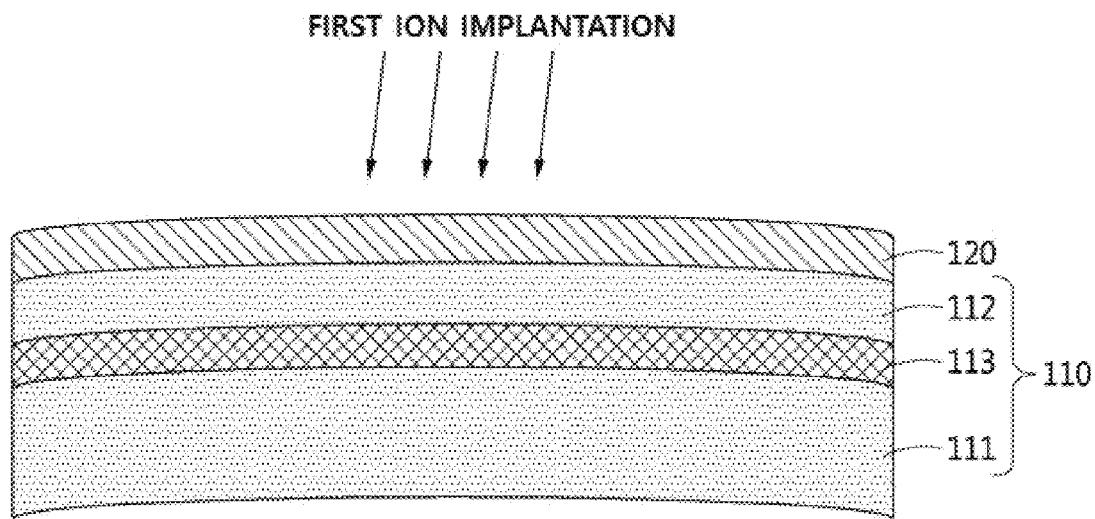

[FIG. 1C]
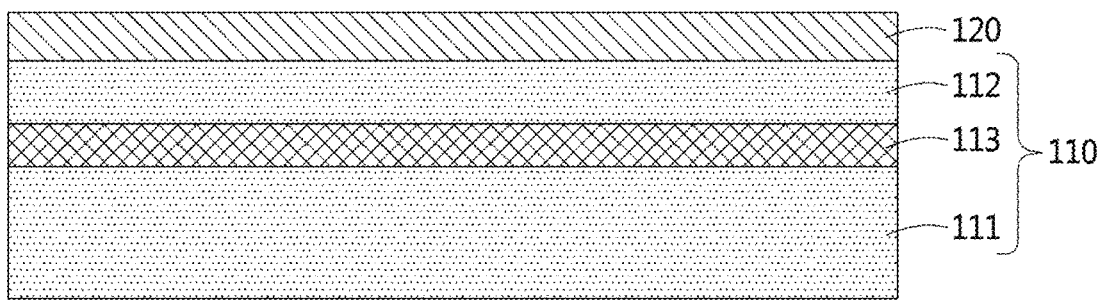
[FIG. 1D]
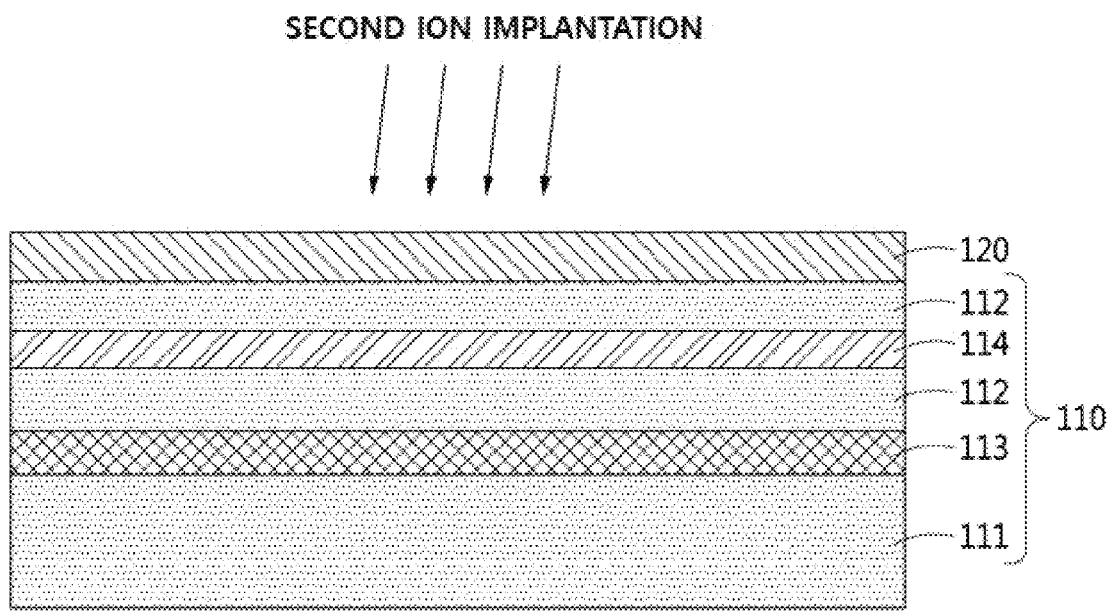

[FIG. 1E]
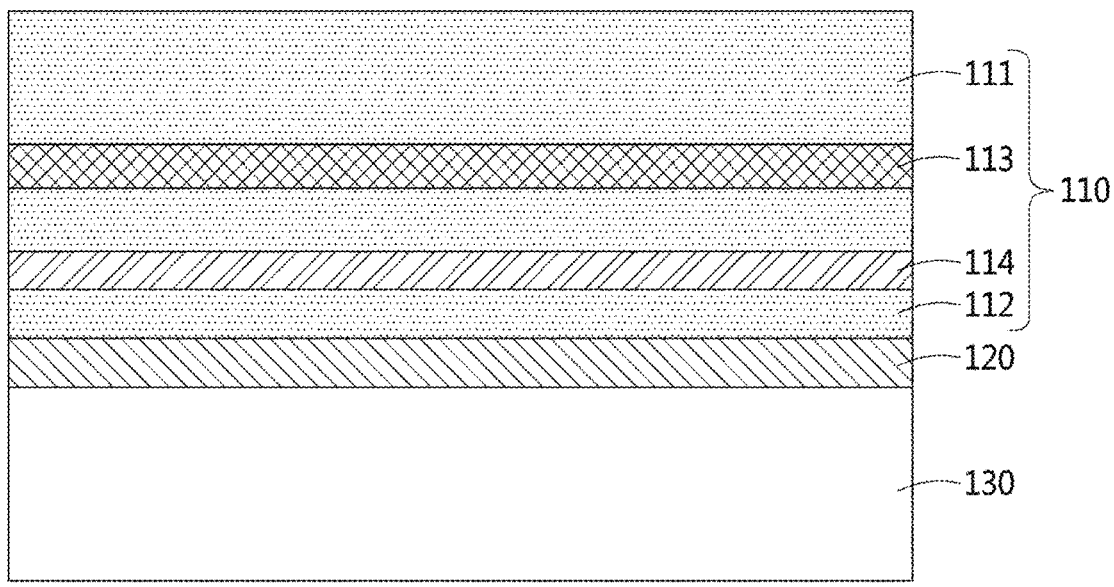
[FIG. 1F]
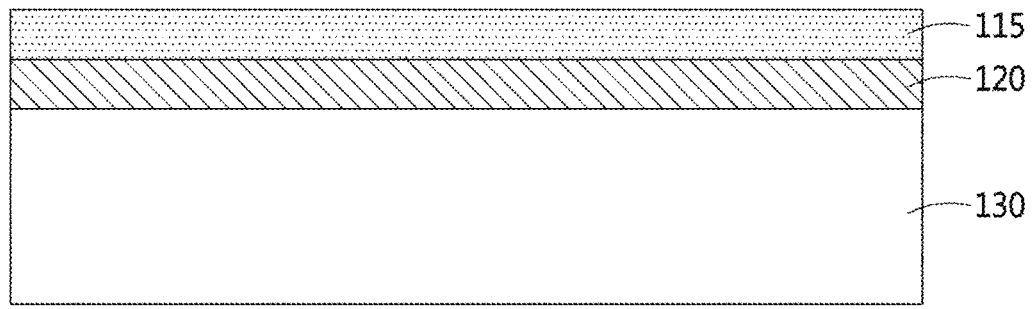

[FIG. 1G]
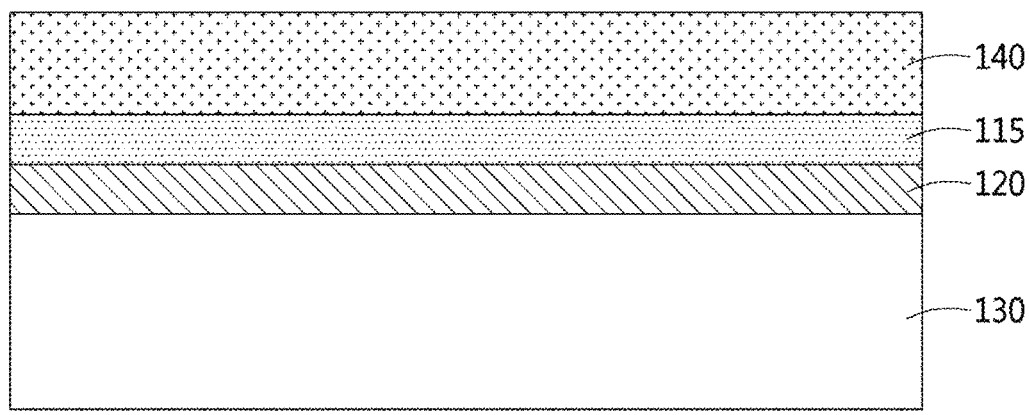
[FIG. 1H]
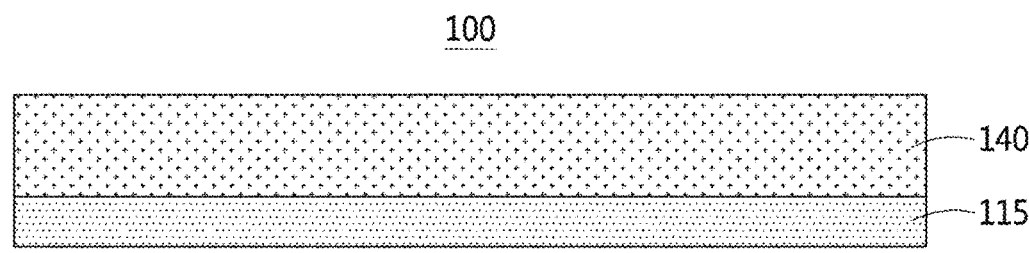

[FIG. 2]
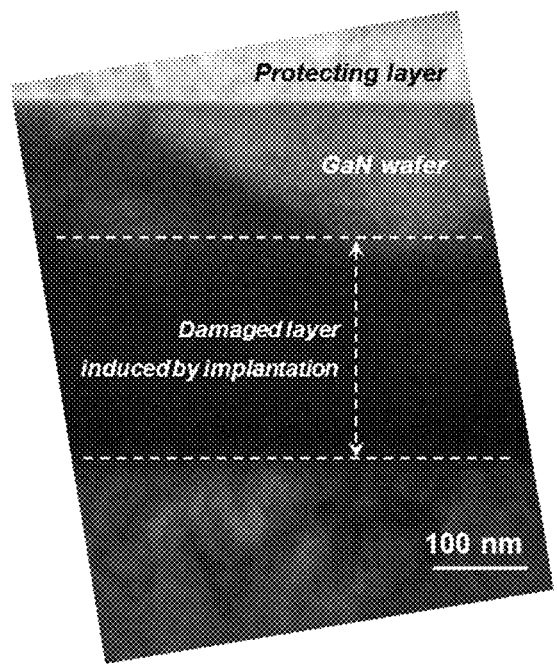
[FIG. 3A]
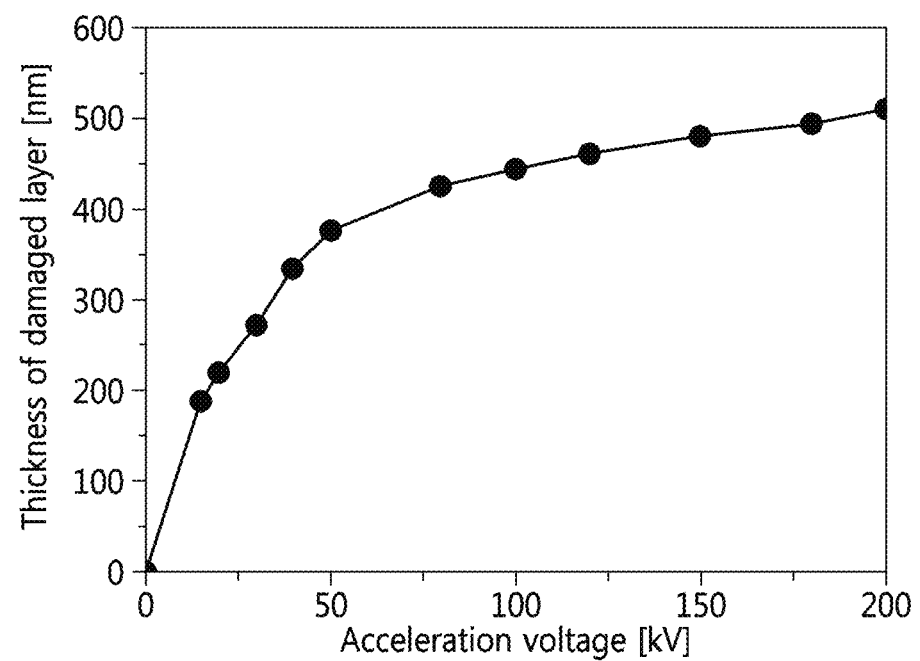

[FIG. 3B]
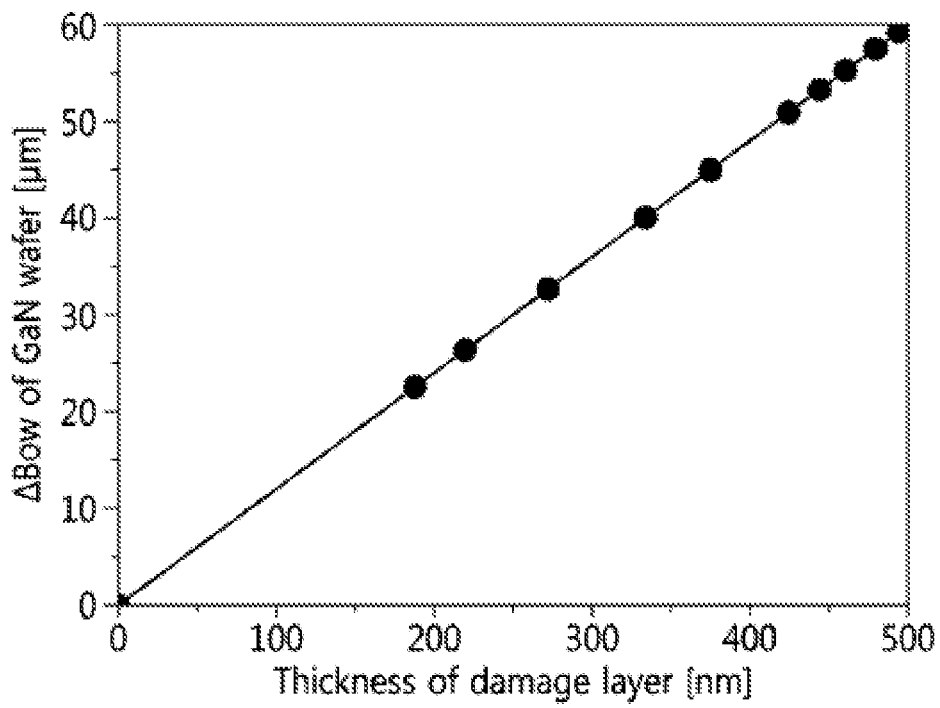
[FIG. 4]
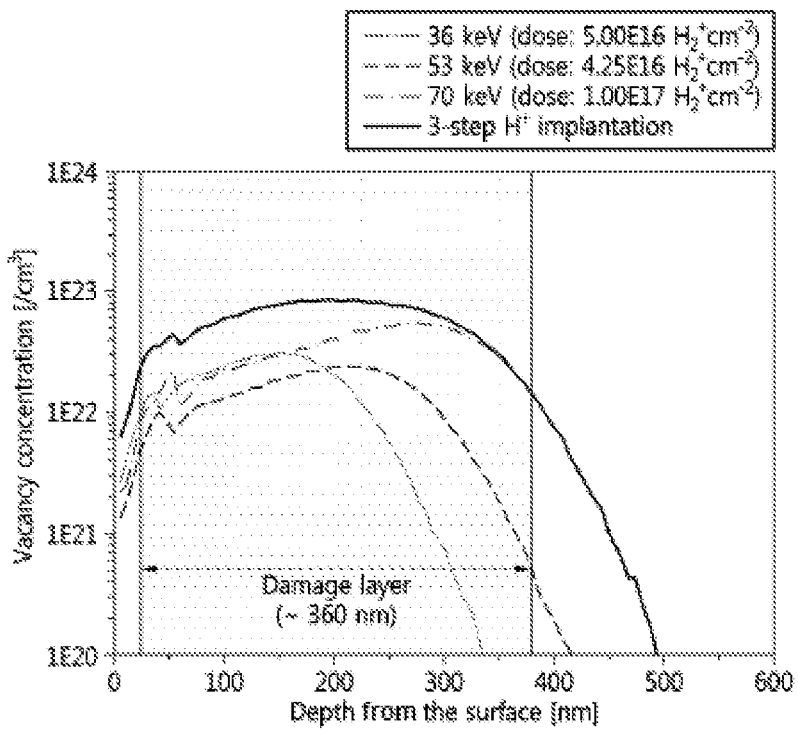

[FIG. 5]
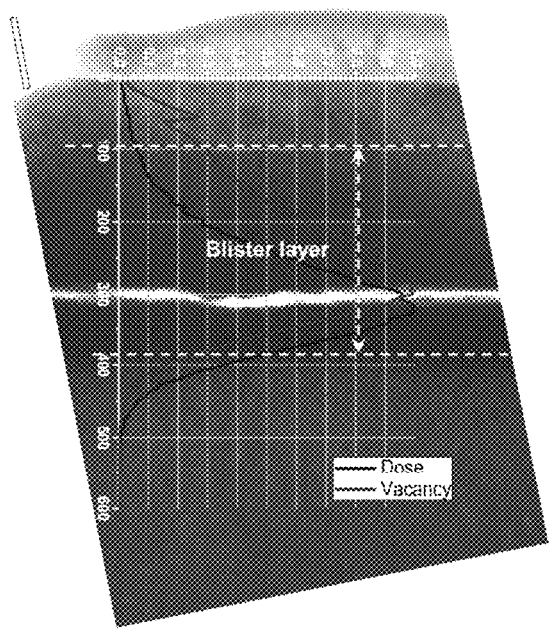
[FIG. 6]
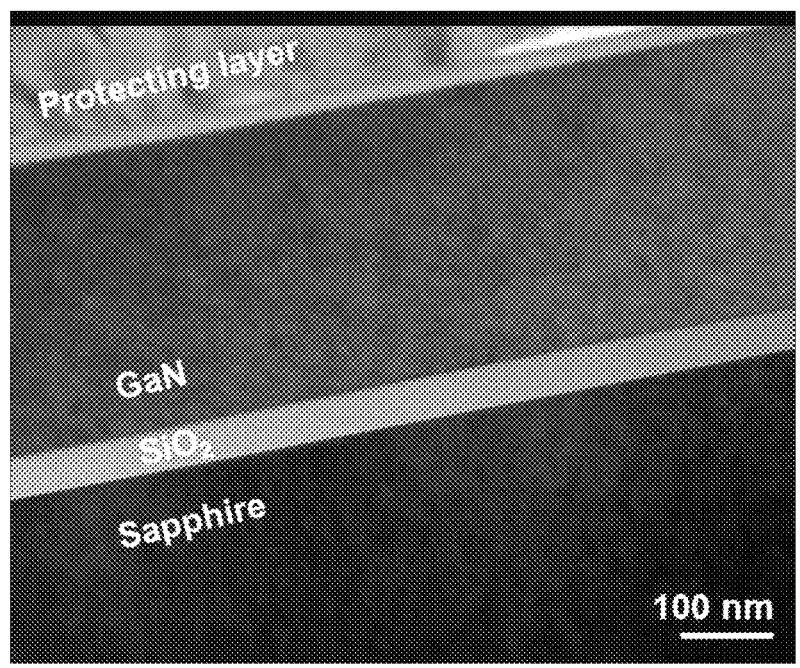

METHOD FOR MANUFACTURING GALLIUM NITRIDE SUBSTRATE USING THE MULTI ION IMPLANTATION

BACKGROUND OF THE DISCLOSURE

Field of the Disclosure

The present disclosure relates to a method of fabricating a gallium nitride substrate using a plurality of ion implantation processes, and more particularly, to a method of fabricating a gallium nitride substrate having high quality and a low defect density by preventing bowing and cracking of the gallium nitride substrate.

Description of the Related Art

The performance and lifespan of semiconductor devices, such as laser diodes and light emitting diodes, are determined by various factors constituting the device, and are particularly affected by a base substrate on which elements are stacked. Several methods of fabricating a high quality semiconductor substrate have been proposed. In addition, interest in III-V compound semiconductor substrates is increasing.

A gallium nitride (GaN) substrate is a typical group III-V compound semiconductor substrate. In addition to a GaAs substrate and an InP substrate, the GaN substrate is suitably used for a semiconductor device. However, the fabrication costs of the GaN substrate are much higher than those of the GaAs substrate or the InP substrate.

In GaN substrates, a crystal growth rate is low because crystal growth is accomplished by a vapor phase method such as hydride vapor phase epitaxy (HVPE) or metal organic chemical vapor deposition (MOCVD). For example, crystalline GaN bulk with a thickness of about 10 mm can be merely obtained in a crystal growth time of 100 hours. From a crystal with such a thickness, a small number of GaN substrates, e.g., 10 GaN substrates, with a thickness of about 200 μm to 400 μm can be merely obtained.

However, when the thickness of GaN films cut out from crystalline GaN bulk is reduced to obtain a larger number of GaN substrates, mechanical strength is decreased, so that self-supporting substrates cannot be formed. Accordingly, there has been a need for a method capable of guaranteeing the strength of GaN thin films cut out from a crystalline GaN bulk.

Conventionally, a substrate fabrication method of bonding a GaN thin film to a substrate having a chemical composition different from GaN to reinforce the strength of a GaN thin film has been used. However, bonded substrates fabricated by this method exhibited a problem that a substrate, which is a type different from a GaN thin film, is easily peeled off of the GaN thin film in a process of laminating a semiconductor layer on the GaN thin film.

To address these problems, Japanese Patent Application Publication No. 2011-243968, Korean Patent No. 10-1581044, and Japanese Patent Application Publication No. 2012-243792 proposed methods of separating a thin film through ion implantation. In such conventional thin film separation methods using ion implantation, hydrogen, helium, or nitrogen ions are implanted into a surface of the crystalline GaN bulk to be bonded to a substrate, which is a type different from the crystalline GaN bulk, to form a damaged layer, and the crystalline GaN bulk including the damaged layer formed thereon is directly bonded to the substrate and then is subjected to heat treatment, followed by separating the crystalline GaN bulk on the damaged layer to fabricate a GaN thin film-bonded substrate.

However, the conventional methods damage crystals inside crystalline GaN bulk, thereby causing appearance deformation such as bowing. In addition, since it is impossible to recycle crystalline GaN bulk, production costs increase.

O. Moutanabbir also proposed a GaN substrate fabrication method of implanting hydrogen ions into both sides of a GaN substrate so as to reduce bow of a GaN substrate. However, this method exhibited a problem that multiple layers of a GaN substrate are damaged due to hydrogen ions implanted to both sides of the GaN substrate, and thus, the quality of the GaN substrate is deteriorated. In addition, the method exhibited a problem that a process is complicated because thermal annealing is performed after ion implantation.

RELATED DOCUMENTS

Patent Documents

Japanese Patent Application Publication No. 2011-243968, "Method of fabrication composite substrate"

Korean Patent No. 10-1581044, "Method of fabricating substrate having single-crystal thin film"

Japanese Patent Application Publication No. 2012-243792, "GaN thin film-bonded substrate, method of fabricating GaN thin film-bonded substrate, GaN-based high electron mobility transistor, and method of fabricating GaN-based high electron mobility transistor"

Non-Patent Document

O. Moutanabbir, Stress Adjustment and Bonding of H-Implanted 2 in. Freestanding GaN Wafer: The Concept of Double-Sided Splitting, 2009

SUMMARY OF THE DISCLOSURE

Therefore, the present disclosure has been made in view of the above problems, and it is one object of the present disclosure to provide a method of fabricating a gallium nitride substrate characterized by performing first ion implantation at least once to reduce bow of first gallium nitride and then performing second ion implantation to address bowing and cracking, as major factors affecting production yield, of the gallium nitride substrate.

It is another object of the present disclosure to provide a method of fabricating a gallium nitride substrate having high quality and a low defect density to prevent both a bowing phenomenon and a cracking phenomenon of a gallium nitride substrate.

It is yet another object of the present disclosure to provide a method of fabricating a gallium nitride substrate characterized by allowing a second gallium nitride, which is used as a seed layer, to grow on a Ga-face of the first gallium nitride to reduce a defect ratio of a gallium nitride substrate.

In accordance with an aspect of the present disclosure, the above and other objects can be accomplished by the provision of a method of fabricating a gallium nitride substrate, the method including a step of forming a bonding oxide film on the first gallium nitride; a step of performing first ion implantation for a surface of the first gallium nitride, on which the bonding oxide film is formed, at least once to form a damaged layer, thereby releasing bow of the first gallium nitride; a step of performing second ion implantation for the surface of the first gallium nitride, on which the bonding oxide film is formed, to form a blister layer; a step of bonding the bonding oxide film of the first gallium nitride to a temporary substrate; a step of separating the first gallium nitride using the blister layer to form a seed layer; and a step of allowing growth of the second gallium nitride using the seed layer to form bulk gallium nitride.

In the step of forming, a thickness of the damaged layer may be controlled according to an acceleration voltage of the first ion implantation.

A bow of the first gallium nitride may be controlled according to the thickness of the damaged layer.

The blister layer may be formed at a depth of 0.1 μm to 4 μm from the surface of the first gallium nitride.

Ion implantation for the blister layer may be performed using at least one of hydrogen, helium, nitrogen, and argon.

The first gallium nitride may include an N-face and a Ga-face.

In the step of performing of the second ion implantation, the blister layer may be formed on the Ga-face of the first gallium nitride.

In the step of performing of the second ion implantation, heat treatment for the blister layer may be further performed The heat treatment may be performed at 400° C. to 800° C.

The step of bonding may be performed at 200° C. to 450° C. for 5 hours.

In the step of allowing, the temporary substrate may be further removed.

The temporary substrate may include an amorphous thin film on a surface thereof.

The amorphous thin film may be at least one of silicon oxide (SiOx), silicon nitride (SiNx), and silicon oxynitride (SiON).

The temporary substrate may be at least one of sapphire, gallium arsenide (GaAs), spinel, silicon (Si), indium phosphide (InP), and silicon carbide (SiC).

BRIEF DESCRIPTION OF THE DRAWINGS

The above and other objects, features and other advantages of the present disclosure will be more clearly understood from the following detailed description taken in conjunction with the accompanying drawings, in which:

FIGS. 1A to 1H are sectional views illustrating a method of fabricating a gallium nitride substrate according to an embodiment of the present disclosure;

FIG. 2 illustrates a transmission electron microscope (TEM) image of first gallium nitride implanted into a Ga-face of first gallium nitride by first ion implantation according to a method of fabricating a gallium nitride substrate according to an embodiment of the present disclosure;

FIG. 3A is a graph illustrating the thickness, which is dependent upon an acceleration voltage of first ion implantation, of a damaged layer according to a method of fabricating a gallium nitride substrate according to an embodiment of the present disclosure;

FIG. 3B is a graph illustrating a bow difference (Δ bow of GaN wafer), which is dependent upon the thickness of a damaged layer fabricated according to a method of fabricating a gallium nitride substrate according to an embodiment of the present disclosure, of first gallium nitride;

FIG. 4 is a graph illustrating a vacancy concentration dependent upon a depth from a surface of a Ga-face of first gallium nitride that has been subjected to first ion implantation according to a method of fabricating a gallium nitride substrate according to an embodiment of the present disclosure;

FIG. 5 is a TEM image and graph illustrating an implanted ion amount and vacancy amount in first gallium nitride formed by performing second ion implantation into a Ga-face of first gallium nitride according to a method of fabricating a gallium nitride substrate according to an embodiment of the present disclosure; and FIG. 6 illustrates a TEM image of a gallium nitride substrate fabricated by a method of fabricating a gallium nitride substrate according to an embodiment of the present disclosure.

DETAILED DESCRIPTION OF THE DISCLOSURE

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present disclosure, and it should be understood that the terms are exemplified to describe embodiments of the present disclosure.

Also, some of the terms used herein may be arbitrarily chosen by the present applicant. In this case, these terms are defined in detail below. Accordingly, the specific terms used herein should be understood based on the unique meanings thereof and the whole context of the present disclosure.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

Hereinafter, a method of fabricating a gallium nitride substrate according to an embodiment of the present disclosure is described in detail with reference to FIGS. 1A to 1H.

FIGS. 1A to 1H are sectional views illustrating a method of fabricating a gallium nitride substrate according to an embodiment of the present disclosure.

The method of fabricating a gallium nitride substrate according to an embodiment of the present disclosure is characterized by forming a bonding oxide film 120 on first gallium nitride 110, and performing first ion implantation for a surface of the first gallium nitride 110, on which the bonding oxide film 120 has been formed, at least once to form a damaged layer 113, thereby reducing bow of the first gallium nitride 110.

Thereafter, the surface of the first gallium nitride 110, on which the bonding oxide film 120 has been formed, is subjected to second ion implantation, thereby forming a blister layer 114.

The bonding oxide film 120 of the first gallium nitride 110 is bonded to a temporary substrate 130, and the first gallium nitride 110 is separated therefrom using the blister layer 114, thereby forming a seed layer 115. Thereafter, second gallium nitride 140 is allowed to grow using the seed layer 115, thereby forming bulk gallium nitride (bulk GaN).

The method of fabricating a gallium nitride substrate according to an embodiment of the present disclosure is characterized by performing the first ion implantation for a surface of the first gallium nitride 110 at least once before performing the second ion implantation to form a damaged layer 113, thereby releasing bow of the first gallium nitride 110. Accordingly, a gallium nitride substrate having high quality and a low defect density may be fabricated, addressing bowing and cracking, as major factors affecting production yield, of a gallium nitride substrate.

Hereinafter, the method of fabricating a gallium nitride substrate according to an embodiment of the present disclosure is described in detail with reference to FIGS. 1A to 1H.

FIG. 1A is a sectional view illustrating a process of forming the first gallium nitride according to the method of fabricating a gallium nitride substrate according to an embodiment of the present disclosure.

Gallium nitride (GaN) is used as a core material for various optical devices due to excellent physical and chemical properties thereof. Gallium nitride is allowed to grow, through heterogeneous epitaxial growth, on a substrate for growth such as sapphire, silicon carbide, or silicon.

In addition, gallium nitride has an important crystalline property, i.e., "crystal polarity," as well as defects.

In gallium nitride (e.g., wurtzite gallium nitride), each gallium atom is tetrahedrally coordinated to four nitrogen atoms. When three strong bonds between each gallium (Ga) atom and three neighboring nitrogen (N) atom nearest the gallium (Ga) atom are directed downward toward a growth substrate, a polarity is +c (also known as Ga-face). When three strong bonds between each gallium (Ga) atom and three neighboring nitrogen (N) atom nearest the gallium (Ga) atoms are directed upward in a growth direction, a polarity is −c (also known as N-face) opposite to +c.

Therefore, gallium nitride may be classified into a Ga-face type and an N-face type according to the directions of the atoms constituting the same (N-face). Here, the label "c" indicates a crystal plane horizontal to a plane of an epitaxial film.

Although the polarity is not a surface property of gallium nitride, it should be noted that the polarity greatly affects bulk properties of gallium nitride. In addition, the properties of gallium nitride may be varied depending upon the polarity. Therefore, a device may be fabricated utilizing polarity characteristics of an epitaxial gallium nitride growth layer. For example, it is preferred to use layers having a Ga-face upon fabrication of gallium nitride components in many cases.

The first gallium nitride 110 used in the method of fabricating a gallium nitride substrate according to an embodiment of the present disclosure includes a Ga-face 112 and an N-face 111.

In addition, since the method of fabricating a gallium nitride substrate according to an embodiment of the present disclosure uses the first gallium nitride 110 including the Ga-face 112 as a seed layer to allow growth of the second gallium nitride, a defect ratio of a gallium nitride substrate may be reduced.

In addition, although it is ideal for the first gallium nitride 110 to have a flat structure without bow, first gallium nitrides generally used have a convex or concave structure having bow upward or downward.

When the first gallium nitride 110 having bow, as illustrated in FIG. 1A, is used, a defect density increases, whereby quality of a gallium nitride substrate is deteriorated.

Therefore, the method of fabricating a gallium nitride substrate according to an embodiment of the present disclosure is characterized by performing the first ion implantation for the first gallium nitride 110 at least once to release bow.

FIGS. 1B and 1C are sectional views illustrating a process of releasing bow of the first gallium nitride by performing the first ion implantation for a surface of the first gallium nitride at least once to form a damaged layer according to the method of fabricating a gallium nitride substrate according to an embodiment of the present disclosure.

According to the method of fabricating a gallium nitride substrate according to an embodiment of the present disclosure, the damaged layer 113 is formed on the first gallium nitride 110 through the first ion implantation, as illustrated in FIG. 1A.

More particularly, the bonding oxide film 120 may be formed on the first gallium nitride 110 illustrated in FIG. 1A.

The bonding oxide film 120 may be made of silicon oxide ($SiO_x$) or aluminum oxide ($Al_2O_3$).

Thereafter, the method of fabricating a gallium nitride substrate according to an embodiment of the present disclosure is characterized by performing the first ion implantation for a surface of the first gallium nitride 110, on which the bonding oxide film 120 has been formed, at least once to form the damaged layer 113, thereby releasing bow of the first gallium nitride 110.

The first ion implantation may be performed at least once. When the first ion implantation is performed several times, an acceleration voltage may be differently controlled.

In addition, in the first ion implantation, ions of at least one of hydrogen, helium, nitrogen, and argon may be used. Preferably, the first ion implantation is performed using hydrogen ions.

When ion implantation for the first gallium nitride 110 is performed once to form the damaged layer 113 according to the method of fabricating a gallium nitride substrate according to an embodiment of the present disclosure, an ion implantation layer may be widely formed.

In addition, when ion implantation for the first gallium nitride 110 is preformed several times to form the damaged layer 113, ion implantation is concentrated on an ion implantation layer first implanted, whereby an ion implantation layer may be uniformly formed.

The damaged layer 113 illustrated in FIG. 1B may include multiple vacancies due to gas bubbles generated inside the first gallium nitride 110. According to the method of fabricating a gallium nitride substrate according to an embodiment of the present disclosure, artificial damage may be formed inside the first gallium nitride 110 due to the multiple vacancies of the damaged layer 113, and the first gallium nitride 110 with a convex or concave structure is flattened by releasing bow of the first gallium nitride 110.

According to the method of fabricating a gallium nitride substrate according to an embodiment of the present disclosure, the first ion implantation may be performed into a convex portion of the first gallium nitride 110.

The damaged layer 113 may be formed by performing the first ion implantation for the first gallium nitride 110 at an acceleration voltage of 10 keV to 200 keV. When the acceleration voltage is 10 keV or less, the thickness of the damaged layer 113 becomes too thin. Accordingly, bow of the first gallium nitride 110 might not be sufficiently released. When acceleration voltage is greater than 200 keV, the thickness of the damaged layer 113 becomes too thick, the first gallium nitride 110 may be bowed in an opposite direction.

In addition, the thickness of the damaged layer 113 may be controlled according to an acceleration voltage of the first ion implantation. Further, a bow degree of the first gallium nitride 110 may be controlled according to the thickness of the damaged layer 113.

The thickness of the damaged layer 113 increases with increasing acceleration voltage of the first ion implantation, and a Δbow, a difference in bow of the first gallium nitride 110 increases with increasing thickness of the damaged layer 113.

The Δbow refers to a difference of bow between an initial first gallium nitride 110 and a bow-released first gallium nitride 110 (i.e., after the first ion implantation).

As illustrated in FIG. 1C, the bow-released first gallium nitride 110 may be obtained by controlling an acceleration voltage of the first ion implantation depending upon a bow degree of the initial first gallium nitride 110.

In the method of fabricating a gallium nitride substrate according to an embodiment of the present disclosure, the angle of the first ion implantation is not specifically limited, and the first ion implantation for the first gallium nitride 110 may be performed at an angle of 0° to 7°. Preferably, a channeling effect can be minimized by irradiating the first gallium nitride 110 with ions at a slope of 7 degrees.

FIG. 1D is a sectional view illustrating a process of performing the second ion implantation for a surface of the first gallium nitride 110, on which the bonding oxide film 120 is formed, to form a blister layer according to the method of fabricating a gallium nitride substrate according to an embodiment of the present disclosure.

According to the method of fabricating a gallium nitride substrate according to an embodiment of the present disclosure, the second ion implantation for a surface of the first gallium nitride 110, on which the bonding oxide film 120 is formed, is performed, thereby forming the blister layer 114.

By the second ion implantation of the method of fabricating a gallium nitride substrate according to an embodiment of the present disclosure, gas bubbles are generated inside the first gallium nitride 110 to form the blister layer 114 including multiple vacancies.

The second ion implantation of the method of fabricating a gallium nitride substrate according to an embodiment of the present disclosure may be performed for the Ga-face 112 of the first gallium nitride 110.

The blister layer 114 may be formed by performing the second ion implantation with an acceleration voltage of 10 keV to 500 keV for the first gallium nitride 110. When the acceleration voltage is 10 keV or less, ion implantation is not sufficiently performed, whereby the first gallium nitride 110 might not be separated. When the acceleration voltage is greater than 500 keV, the thickness of the blister layer 114 becomes too thick, whereby defects of the first gallium nitride 110 may increase.

In addition, the second ion implantation may be performed using ions of at least one of hydrogen, helium, nitrogen, and argon. Preferably, the second ion implantation is performed using hydrogen ions.

In addition, according to the method of fabricating a gallium nitride substrate according to an embodiment of the present disclosure, the second ion implantation is performed for the first gallium nitride 110 at an acceleration voltage lower than that of the first ion implantation, thereby forming the blister layer 114.

A depth of an ion-implanted layer from the first gallium nitride 110 may be controlled according to the magnitude of an acceleration voltage. When the acceleration voltage is high, the ion-implanted layer is formed at a deeper position from the first gallium nitride 110, and, when the acceleration voltage is low, the ion-implanted layer is formed at a shallower position from the first gallium nitride 110.

Accordingly, by the second ion implantation according to the method of fabricating a gallium nitride substrate according to an embodiment of the present disclosure, the blister layer 114 is formed at a shallow position from the surface of the first gallium nitride 110 so as to form a thin seed layer. Accordingly, the second ion implantation may be performed at a lower acceleration voltage than that of the first ion implantation.

On the other hand, since the first ion implantation is performed for the first gallium nitride 110 so as to release bow, it is performed at a higher acceleration voltage than that of the second ion implantation. Accordingly, the damaged layer 113 may be formed at a deep position.

In the method of fabricating a gallium nitride substrate according to an embodiment of the present disclosure, the angle of the second ion implantation is not specifically limited, and the second ion implantation for the first gallium nitride 110 may be performed at an angle of 0° to 7°. Preferably, channeling effect can be minimized by irradiating the first gallium nitride 110 with ions at a slope of 7 degrees.

According to an embodiment, the blister layer 114 may be formed at a depth of 0.1 µm to 4 µm from the surface of the first gallium nitride 110.

When the depth of the blister layer 114 is shallow, i.e., 0.1 µm or less, ion implantation is not sufficiently performed. Accordingly, the first gallium nitride 110 might not be separated. When the depth of the blister layer 114 is greater than 4 µm, defects of the first gallium nitride 110 may increase due to the excessive thickness of the blister layer 114.

The method of fabricating a gallium nitride substrate according to an embodiment of the present disclosure may further include, after performing the second ion implantation for the first gallium nitride 110 to from the blister layer 114, a process of heat-treating the blister layer 114.

The heat treatment may be performed at a temperature, at which the first gallium nitride 110 is not separated by the blister layer 114 and the first gallium nitride 110 is separated, or at a lower temperature so as to release stress of the first gallium nitride 110 caused by the first and second ion implantation and accomplish effective ion implantation into the first gallium nitride 110.

For example, the heat treatment may be performed at 400° C. to 800° C. When the heat treatment temperature is 400° C. or less, stress of the first gallium nitride 110 is not sufficiently reduced, and, when the heat treatment temperature is higher than 800° C., the first gallium nitride 110 may be separated by the blister layer 114.

FIG. 1E is a sectional view illustrating a process of bonding the bonding oxide film 120 of the first gallium nitride 110 to the temporary substrate 130 according to the method of fabricating a gallium nitride substrate according to an embodiment of the present disclosure.

The method of fabricating a gallium nitride substrate according to an embodiment of the present disclosure includes a process of bonding the temporary substrate 130 so as to separate the blister layer 114 of the first gallium nitride 110 in a subsequent process.

For example, the method of fabricating a gallium nitride substrate according to an embodiment of the present disclosure may include a process of bonding the first gallium nitride 110 to the temporary substrate 130 using the bonding oxide film 120 formed on the surface of the first gallium nitride 110, as illustrated in FIG. 1E.

According to an embodiment, the first gallium nitride 110 may be bonded to the temporary substrate 130 by heat or pressure. Preferably, the temporary substrate 130 may be bonded by holding the first gallium nitride 110 at 200° C. to 450° C. for 5 hours.

When temperature used to bond the temporary substrate 130 to the first gallium nitride 110 is too high, defects (e.g., cleavage) may occur before the bonding.

The temporary substrate 130 may be at least one of sapphire, gallium arsenide (GaAs), spinel, silicon (Si), indium phosphide (InP), and silicon carbide (SiC).

According to an embodiment, the temporary substrate 130 may include an amorphous thin film on a surface thereof. The amorphous thin film may be at least one of silicon oxide (SiOx), silicon nitride (SiNx), and silicon oxynitride (SiON).

FIG. 1F is a sectional view illustrating a process of separating the first gallium nitride 110 according to the method of fabricating a gallium nitride substrate according to an embodiment of the present disclosure to form the seed layer 115.

In the method of fabricating a gallium nitride substrate according to an embodiment of the present disclosure, the temporary substrate 130 is separated from the first gallium nitride 110 using the blister layer 114 by a heat treatment method or a mechanical method (e.g., cutting), thereby forming the seed layer 115.

In addition, in the method of fabricating a gallium nitride substrate according to an embodiment of the present disclosure, the first gallium nitride 110 may be separated from the blister layer 114 through crystal rearrangement and bubble coagulation in the blister layer 114 by heat-treating the temporary substrate 130.

Heat treatment may be used when the blister layer 114 is formed at a relatively shallow position inside the first gallium nitride 110. By heat-treating the first gallium nitride 110 and the temporary substrate 130 bonded to each other, the ion blister layer 114 is embrittled, and the first gallium nitride 110 is separated from the embrittled ion blister layer 114 remaining the seed layer 115. The heat treatment may be performed at 400° C. to 800° C. depending upon the characteristics of ions.

In the method of fabricating a gallium nitride substrate according to an embodiment of the present disclosure, the first gallium nitride 110 might not be separated when the heat treatment is performed at less than 400° C. On the other hand, the first gallium nitride 110 may be previously separated when the heat treatment is performed at greater than 800° C., thereby affecting a yield.

In addition, in the method of fabricating a gallium nitride substrate according to an embodiment of the present disclosure, a mechanical method may be used when the blister layer 114 is formed at a relatively deep position. This mechanical method also has excellent precision, may be easily performed, and may ensure separation of the first gallium nitride 110.

According to the method of fabricating a gallium nitride substrate according to an embodiment of the present disclosure, the first gallium nitride 110 may be separated by the aforementioned heat treatment method or mechanical method after the second ion implantation, thereby obtaining the seed layer 115 having a flat separation surface.

FIG. 1G is a sectional view illustrating a process of allowing growth of the second gallium nitride 140 according to the method of fabricating a gallium nitride substrate according to an embodiment of the present disclosure to form bulk gallium nitride.

Referring to FIG. 1G, the second gallium nitride 140 is allowed to grow on the seed layer 115, which has been formed on the temporary substrate 130, to form the bulk gallium nitride according to the method of fabricating a gallium nitride substrate according to an embodiment of the present disclosure.

In the method of fabricating a gallium nitride substrate according to an embodiment of the present disclosure, the second gallium nitride 140 may be allowed to grow using any one method of hydride vapor phase epitaxy (HVPE), metalorganic chemical vapor deposition (MOCVD), molecular beam epitaxy (MBE), sublimation, and liquid phase methods such as a flux method and a high nitrogen pressure solution method.

In the method of fabricating a gallium nitride substrate according to an embodiment of the present disclosure, the second gallium nitride 140 is allowed to grow using the Ga-face 112 of the first gallium nitride 110 as the seed layer 115, thereby reducing a defect ratio in the gallium nitride substrate.

FIG. 1H is a sectional view illustrating a gallium nitride substrate fabricated by the method of fabricating a gallium nitride substrate according to an embodiment of the present disclosure.

Referring to FIG. 1H, a gallium nitride substrate 100 having a self-standing structure may be fabricated by removing the temporary substrate 130 and the bonding oxide film 120 according to the method of fabricating a gallium nitride substrate according to an embodiment of the present disclosure.

A gallium nitride substrate having a template substrate structure may be fabricated by terminating a process, without removal of the temporary substrate 130, after the growth of the second gallium nitride 140, as illustrated in FIG. 1G, according to an embodiment of the method of fabricating a gallium nitride substrate according to an embodiment of the present disclosure.

Hereinafter, the characteristics of the gallium nitride substrate fabricated by the method of fabricating a gallium nitride substrate according to an embodiment of the present disclosure are described in detail with reference to FIGS. 2 to 5.

FIG. 2 illustrates a transmission electron microscope (TEM) image of first gallium nitride implanted into a Ga-face of first gallium nitride by first ion implantation according to the method of fabricating a gallium nitride substrate according to an embodiment of the present disclosure.

Referring to FIG. 2, the first gallium nitride including a Ga-face and an N-face, as illustrated in FIG. 1A, was subjected to the first ion implantation, as illustrated in FIG. 1B, thereby forming a damaged layer having a thickness of 234 nm.

In addition, a bow degree of the initial first gallium nitride, as illustrated in FIG. 1A, was −12 μm, but a bow-released first gallium nitride, as illustrated FIG. 1C, formed by forming a damaged layer with a thickness of 234 nm in the first gallium nitride as illustrated in FIG. 1B had a bow degree of +19 μm and thus exhibited a Δbow of +31.

FIG. 3A is a graph illustrating the thickness, which is dependent upon an acceleration voltage of first ion implantation, of a damaged layer according to the method of fabricating a gallium nitride substrate according to an embodiment of the present disclosure.

Referring to FIG. 3A, it can be confirmed that the thickness of the damaged layer is changed according to an acceleration voltage of the first ion implantation in the method of fabricating a gallium nitride substrate according to an embodiment of the present disclosure.

FIG. 3B is a graph illustrating a difference of bow (Δ bow of GaN wafer), which is dependent upon the thickness of a damaged layer fabricated according to the method of fabricating a gallium nitride substrate according to an embodiment of the present disclosure, of first gallium nitride.

Referring to FIG. 3B, it can be confirmed that a Δ bow of the first gallium nitride depends upon the thickness of the damaged layer generated by the first ion implantation in the method of fabricating a gallium nitride substrate according to an embodiment of the present disclosure.

The Δ bow refers to a difference of bow degree between an initial first gallium nitride and a bow-released first gallium nitride.

Therefore, referring to FIGS. 3A and 3B, bow of the first gallium nitride may be easily controlled by adjusting the acceleration voltage of the first ion implantation according to the bow degree of the initial first gallium nitride as illustrated in FIG. 1A.

FIG. 4 is a graph illustrating a vacancy concentration dependent upon a depth from a surface of a Ga-face of first gallium nitride that has been subjected to first ion implantation according to the method of fabricating a gallium nitride substrate according to an embodiment of the present disclosure.

Referring to FIG. 4, the first ion implantation was performed for the Ga-face of the first gallium nitride at respective acceleration voltages of 36 keV, 53 keV, and 70 keV according to the method of fabricating a gallium nitride substrate according to an embodiment of the present disclosure. In addition, the first ion implantation was performed for the Ga-face of the first gallium nitride three times (3-step $H^+$ implantation) at respective acceleration voltages of 36 keV, 53 keV, and 70 keV.

Referring to FIG. 4, it can be confirmed that a vacancy concentration of the damaged layer increased with increasing acceleration voltage of the first ion implantation in the method of fabricating a gallium nitride substrate according to an embodiment of the present disclosure.

The following Table 1 shows a bow difference (Δbow) according to an acceleration voltage of the first ion implantation according to the method of fabricating a gallium nitride substrate according to an embodiment of the present disclosure.

TABLE 1

| Allium nitride (GaN) substrate | Bow | Bow difference Δ bow) |
|---|---|---|
| Thickness of gallium nitride (GaN) substrate: 368 μm | | |
| After laser lift-off | −180 μm | — |
| First ion implantation at acceleration voltage of 36 keV | −177 μm | +3 μm |
| First ion implantation at acceleration voltage of 53 keV | −170 μm | +7 μm |
| First ion implantation at acceleration voltage of 70 keV | −142 μm | +28 μm |
| Performing first ion implantation three times (at respective voltages of 36 keV, 53 keV and 70 keV) | | +38 μm |

Referring to Table 1, a Δ bow was +3 μm when the first ion implantation was performed at an acceleration voltage of 36 keV, a Δ bow was +7 μm when the first ion implantation was performed at an acceleration voltage of 53 keV, a Δ bow was +28 μm when the first ion implantation was performed at an acceleration voltage of 70 keV, and a Δ bow was +38 μm when the first ion implantation for the Ga-face of the first gallium nitride was performed at acceleration voltages of 36 keV, 53 keV, and 70 keV, i.e., three times.

From these results, it can be confirmed that the Δ bow increases with increasing acceleration voltage of the first ion implantation in the method of fabricating a gallium nitride substrate according to an embodiment of the present disclosure.

In addition, it can be confirmed that the thickness of the damaged layer further increases when the first implantation is performed three times while increasing the acceleration voltage thereof.

FIG. 5 is a TEM image and graph illustrating an implanted ion amount and vacancy amount in first gallium nitride formed by performing second ion implantation into a Ga-face of first gallium nitride according to the method of fabricating a gallium nitride substrate according to an embodiment of the present disclosure.

According to the second ion implantation of the method of fabricating a gallium nitride substrate according to an embodiment of the present disclosure, ions were implanted in an amount of $1.3 \times 10^{17}$ $H_2^+/cm^2$ using an energy of 70 KeV, thereby forming a blister layer with a thickness of 286 nm. In addition, after the second ion implantation, the first gallium nitride was heat-treated at 500° C. for 30 minutes.

Referring to FIG. 5, a blister layer with a thickness of about 300 nm was formed inside the first gallium nitride by the second ion implantation according to the method of fabricating a gallium nitride substrate according to an embodiment of the present disclosure. Accordingly, ion and vacancy amounts in the blister layer increased.

It can be confirmed that the blister layer, in which multiple vacancies are formed, is satisfactorily formed inside the first gallium nitride by the second ion implantation according to the method of fabricating a gallium nitride substrate according to an embodiment of the present disclosure.

FIG. 6 illustrates a TEM image of a gallium nitride substrate fabricated by the method of fabricating a gallium nitride substrate according to an embodiment of the present disclosure.

Referring to FIG. 6, gallium nitride has been allowed to grow on a silicon oxide layer formed on a sapphire substrate, and a resultant gallium nitride substrate did not exhibit a bowing phenomenon and a cracking phenomenon. As a result, fabrication of a gallium nitride substrate having high quality and a low defect density while addressing both a bowing phenomenon and a cracking phenomenon was completed.

According to an embodiment of the present disclosure, a gallium nitride substrate, wherein bow of first gallium nitride is reduced by performing first ion implantation at least once and then bowing and cracking, as major factors affecting production yield, of the gallium nitride substrate are addressed by performing second ion implantation, can be provided.

In addition, according to an embodiment of the present disclosure, a gallium nitride substrate having high quality and a low defect density can be fabricated by preventing both a bowing phenomenon and a cracking phenomenon of the gallium nitride substrate.

According to an embodiment of the present disclosure, a gallium nitride substrate having a reduced defect ratio by allowing a second gallium nitride, which is used as a seed layer, to grow on a Ga-face of the first gallium nitride can be provided.

Although the present disclosure has been described through limited examples and figures, the present disclosure is not intended to be limited to the examples. Those skilled in the art will appreciate that various modifications, additions, and substitutions are possible, without departing from the scope and spirit of the disclosure.

Therefore, it should be understood that there is no intent to limit the disclosure to the embodiments disclosed herein, rather, the disclosure is to cover all modifications, equivalents, and alternatives falling within the spirit and scope of the disclosure as defined by the claims.

DESCRIPTION OF SYMBOLS

100: GALLIUM NITRIDE SUBSTRATE
110: FIRST GALLIUM NITRIDE
111: N-FACE
112: Ga-FACE
113: DAMAGED LAYER
114: BLISTER LAYER
115: SEED LAYER
120: BONDING OXIDE FILM
130: TEMPORARY SUBSTRATE
140: SECOND GALLIUM NITRIDE

What is claimed is:

1. A method of fabricating a gallium nitride substrate, the method comprising:
    forming a bonding oxide film on a first gallium nitride, said first gallium nitride substrate having a bow;
    performing a first ion implantation at least once by irradiating ions at an acceleration voltage of 10 keV to 200 keV with about 7 degrees slope from a perpendicular axis with regard to a surface of the first gallium nitride substrate, on which the bonding oxide film is formed, to form a damaged layer, thereby releasing the bow of the first gallium nitride;
    performing a second ion implantation by irradiating ions at about 7 degrees slope from a perpendicular axis with regard to the surface of the first gallium nitride, on which the bonding oxide film is formed, to form a blister layer;
    bonding the bonding oxide film of the first gallium nitride to a temporary substrate;
    separating the first gallium nitride using the blister layer to form a seed layer; and
    allowing growth of a second gallium nitride on the seed layer to form bulk gallium nitride,
    wherein the thickness of the damaged layer is 200-500 nm and Δbow of the first gallium nitride is a 20-60 μm, wherein said Δbow being a bow difference between an initial first gallium nitride and a bowing-released first gallium nitride after the first ion implantation.

2. The method according to claim 1, wherein the blister layer is formed at a depth of 0.1 μm to 4 μm from the surface of the first gallium nitride.

3. The method according to claim 1, wherein the second ion implantation for the blister layer is performed using at least one of hydrogen, helium, nitrogen, and argon.

4. The method according to claim 1, wherein the first gallium nitride comprises an N-face and a Ga-face.

5. The method according to claim 4, wherein, in the performing of the second ion implantation, the blister layer is formed on the Ga-face of the first gallium nitride.

6. The method according to claim 1, wherein, in the performing of the second ion implantation, heat treatment for the blister layer is further performed.

7. The method according to claim 6, wherein the heat treatment is performed at 400° C. to 800° C.

8. The method according to claim 1, wherein the bonding is performed at 200° C. to 450° C. for 5 hours.

9. The method according to claim 1, wherein, in the allowing, the temporary substrate is further removed.

10. The method according to claim 1, wherein the temporary substrate comprises an amorphous thin film on a surface thereof.

11. The method according to claim 10, wherein the amorphous thin film is at least one of silicon oxide (SiOx), silicon nitride (SiNx), and silicon oxynitride (SiON).

12. The method according to claim 1, wherein the temporary substrate is at least one of sapphire, gallium arsenide (GaAs), spinel, silicon (Si), indium phosphide (InP), and silicon carbide (SiC).

* * * * *